United States Patent [19]

Friedman et al.

[11] Patent Number: 5,983,388
[45] Date of Patent: Nov. 9, 1999

[54] FORWARD ERROR CORRECTION ARRANGEMENT (FEC) FOR MULTIPOINT TO SINGLE POINT COMMUNICATION SYSTEMS

[75] Inventors: Vladimir Friedman, Scotch Plains, N.J.; Mark Russell, Austin, Tex.; Stuart D. Sandberg, Arlington; Peter N. Heller, Somerville, both of Mass.

[73] Assignees: Analog Devices, Norwood; Aware Inc., Bedford, both of Mass.

[21] Appl. No.: 08/917,664

[22] Filed: Aug. 25, 1997

[51] Int. Cl.⁶ .................................................. H03M 13/00
[52] U.S. Cl. ...................... 714/776; 714/701; 714/752; 375/354; 711/157
[58] Field of Search .................................. 714/701, 751, 714/752, 755, 762, 776, 784, 792; 370/391, 404, 474, 509; 375/260, 261, 264, 265, 280, 298, 354, 366, 368; 711/157

[56] References Cited

U.S. PATENT DOCUMENTS

| | | | |
|---|---|---|---|
| 4,945,549 | 7/1990 | Simon et al. | 375/280 |
| 5,506,956 | 4/1996 | Cohen | 714/821 |
| 5,511,096 | 4/1996 | Huang et al. | 375/265 |
| 5,519,830 | 5/1996 | Opoczynski | 714/47 |
| 5,586,121 | 12/1996 | Moura et al. | 370/404 |
| 5,596,604 | 1/1997 | Cioffi et al. | 375/260 |
| 5,621,753 | 4/1997 | Weber | 375/202 |
| 5,719,875 | 2/1998 | Wei | 714/762 |
| 5,898,710 | 4/1999 | Amrany | 711/157 |

*Primary Examiner*—Emmanuel L. Moise
*Attorney, Agent, or Firm*—Samuels, Gauthier & Stevens, LLP

[57] ABSTRACT

A forward error correction (FEC) system and method for use in a multipoint-to-point frame based synchronized transmission communication system in which data from users are sent in selected portions of data frames having coded symbols added thereto by encoders associated with each user. The number of bits per user assigned portions of data frames is established as an integer number of FEC code symbols. The interleaving depth is set equal to a multiple of the total number of code symbols sent by a user in a data frame. The encoders are synchronized such that all of the encoders start processing associated interleaving frames at the same time. In exemplary embodiments, the communication systems include DWMT and TDM communication systems.

32 Claims, 8 Drawing Sheets

USER A

PARITY CHECK BYTES

USER B

PARITY CHECK BYTES

USER C

PARITY CHECK BYTES

FORWARD ERROR CORRECTION ARRANGEMENT (FEC) FOR MULTIPOINT TO SINGLE POINT COMMUNICATION SYSTEMS

BACKGROUND OF THE INVENTION

The invention relates to a forward error correction (FEC) arrangement for multipoint to single point communication systems such as discrete wavelet multitone (DMT(DWMT)) systems and time division multiplexed (TDM) systems.

Conventional FEC methods use a combination of data interleaving and coding (Reed-Solomon codes are the most frequently used) to achieve protection against burst error events, e.g. impulse noise. At the transmit side of a communication system, data is scrambled into an interleaving RAM and coded. At the receiver side, the data is descrambled after error correction. The scrambling of the data has the effect of spreading the errors due to burst error events along many code words so that they can be corrected by using codes with a reduced error correction capability.

Many interleaving methods have been developed over the years. The oldest are the block interleaving, systematic (code) interleaving and convolutional (Ramsey type) interleaving. Recently, new methods have been proposed in conjunction with ADSL/VDSL applications.

Finding an efficient solution for FEC with interleaving in the case of multipoint to single point transmission systems is particularly difficult. One evident solution is the use of a FEC interleaving scheme for each multiuser as shown in FIG. 1. A 3-to-1 communication system 100 includes data input lines $102_1$–$102_3$, interleavers $104_1$–$104_3$, RS coders $106_1$–$106_3$, and transmitters $108_1$–$108_3$ on the transmit side. The data is transmitted over a data channel 110, e.g., twisted pair, to a receiver 112. The receive side of system 100 includes RS decoders $114_1$–$114_3$, deinterleavers $116_1$–$116_3$, and output data lines $118_1$–$118_3$.

There are three components which are expensive to implement in every FEC/interleaver system. The components are the interleaver RAM at the transmit side, and the deinterleaver RAM and the Reed-Solomon decoder at the receive side. One additional problem arises when the data rate from each multiuser is adjusted according to the multiuser individual needs. In these cases, the size of the interleaver/deinterleaver RAM for each multiuser should accommodate the maximum data rate. This results in large interleaver and deinterleaver RAMs for each user, which are seldom used at full capacity.

SUMMARY OF THE INVENTION

The interleaving method in accordance with the invention is particularly suited for DMT(DWMT) and TDM based multipoint to point communication systems. The use of a systematic interleaver leads to a minimum RAM size at the transmit side, while the FEC method allows the decoding/deinterleaving of all multiusers data with only one RAM and one Reed-Solomon decoder.

Accordingly the invention provides a forward error correction (FEC) system and method for use in a multipoint-to-point frame based synchronized transmission communication system in which data from users are sent in selected portions of interleaving frames having coded symbols added thereto by encoders associated with each user. The number of bits per user assigned portions of data frames is established as an integer number of FEC code symbols. The interleaving depth is set equal to the total number of code symbols sent by a user in a data frame. The encoders are synchronized such that all of the encoders start processing associated interleaving frames at the same time. In exemplary embodiments, the communication systems include DWMT and TDM communication systems.

DETAILED DESCRIPTION OF THE ILLUSTRATED EMBODIMENTS

Figure 1:
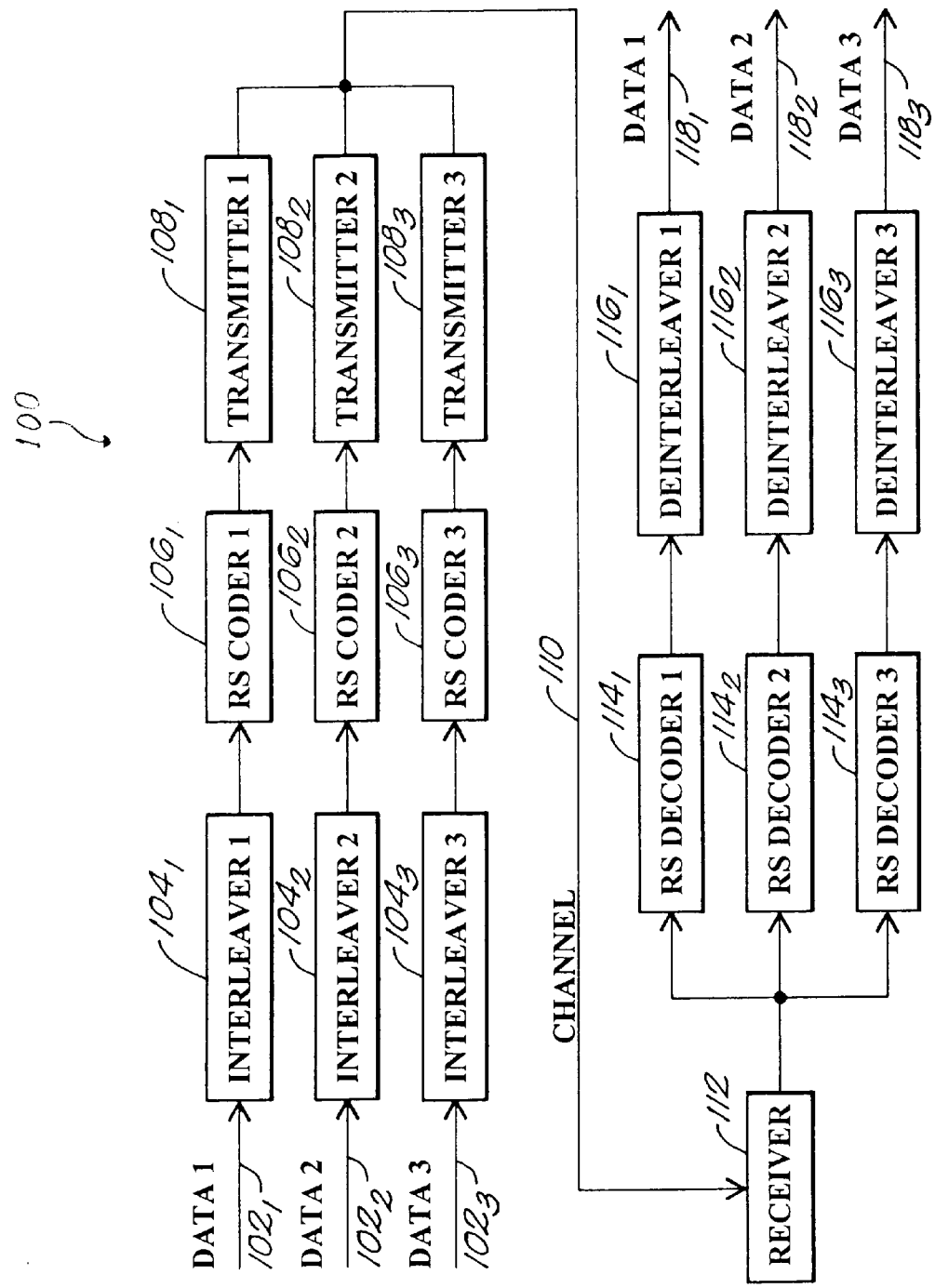
FIG. 1 is a block diagram of a conventional FEC interleaving scheme.
Figure 2:
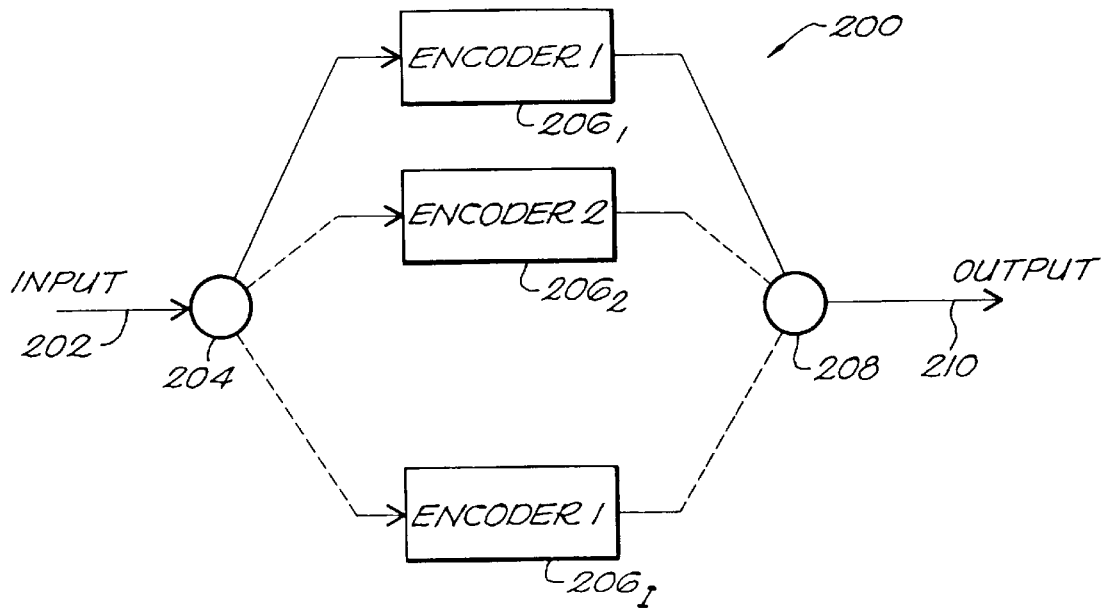
FIG. 2 is a block diagram of a systematic code interleaver.

With reference now to FIG. 2, a block diagram of an exemplary systematic code interleaver 200 is shown. The interleaver includes an input line 202, a multiplexer 204, I encoders (I being the interleaver depth) $206_1$–$206_I$, a demultiplexer 208, and an output line 210.

The multiplexer 204 sends a first data symbol to the output via a first encoder $206_1$, which computes and stores the partial checksums. The second data symbol is sent via the second encoder $206_2$, and the Ith data symbol via the Ith encoder $206_I$. After the information symbols from an interleaving frame have been sent, the parity bytes, retrieved from the encoders, are multiplexed via demultiplexer 208 to the output line 210.

The system and method described with reference to FIG. 2 is called systematic interleaving because the output data stream is identical to the input data stream if parity symbols are removed, i.e., there is no data scrambling. The position of adjacent input data symbols with respect to each other is the same in the output data stream, only each symbol belongs to another RS codeword. No data storage is necessary for interleaving except for the partial checksums.

Figure 3:
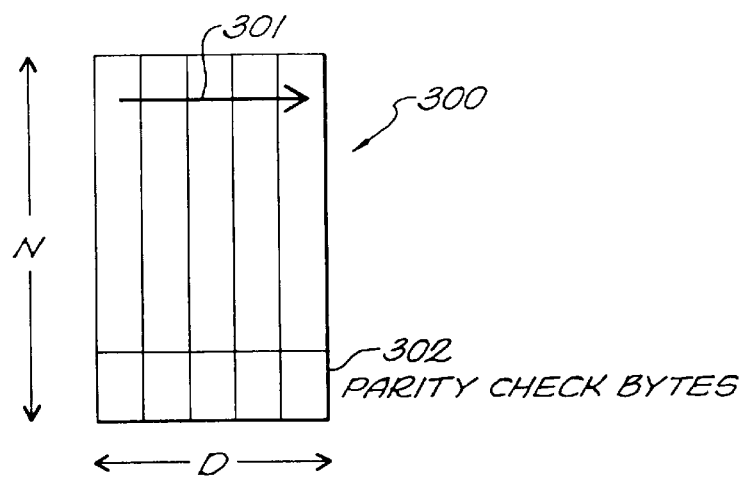
FIG. 3 is a block diagram of a receiver deinterleaver RAM.

FIG. 3 is a block diagram of a receiver deinterleaver RAM. At the receiver, the data from an interleaving frame is stored in a two dimensional memory array 300, e.g., RAM array, with N rows (N is the RS block length) and I columns. The data 301 is written along the rows. Each column contains a Reed Solomon codeword. After the error correction, data is read in the same way as it was written, i.e., along the rows first. The RS codewords can not be moved from the RAM into the RS decoder, the correction must be done within the RAM before the data can be moved out. As a result, double buffering is required.

Figure 4:
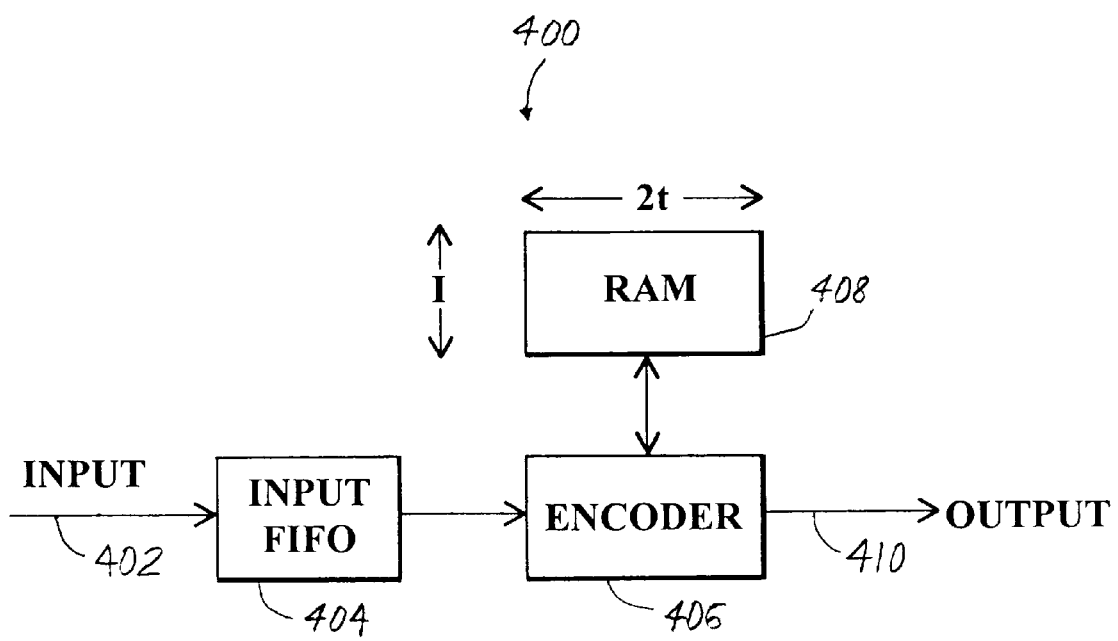
FIG. 4 is a block diagram of an exemplary encoder/interleaver arrangement.

On the transmit side of a communication system, only one symbol is processed at a time, the interleaver can be implemented by a single encoder, time-shared between all the code words as shown in FIG. 4. FIG. 4 is a block diagram of an exemplary encoder/interleaver arrangement 400. The arrangement includes an input line 402, an input FIFO memory unit 404, an encoder 406, an Ix2t RAM 408 and an output line 410.

The updates of the parity symbols are stored in the two-dimensional RAM array with I rows and 2t columns (t is the code error correction capacity with 2t being the number of parity symbols in a codeword of length N). When a symbol belonging to the k-th RS codeword comes to the encoder input, the parity symbols from the k-th RAM row are updated. It will be appreciated that the RAM size is small 2•t•I versus N•I for other interleaving methods. This makes systematic interleaving well suited for DMT(DWMT) multipoint-to-point communications.

The parity symbols are sent to the output at the end of the interleaving frame. During this interval, the input data must be stored in a FIFO of the same size as the RAM. Because the code interleaving is not a conventional method, double buffering is necessary at the receiver. One buffer is used for read/write operations, the other for error correction. The total memory storage required is 2•(N+t)•I. This is roughly equal to the memory required by the convolutional method used in ADSL DMT, and it is twice the memory requirements for a Ramsey type of interleaver.

In DMT(DWMT) transmission, a certain number of bits are assigned to each frequency bin. The data is organized in frames, each frame represents the inverse FFT(FWT) (Fast Wavelet Transform) of the individual bin constellations. At the receiver side, the data is recovered by using an FFT (FWT) transform followed by equalization and slicing.

For multipoint-to-point configurations, each user is assigned a certain number of consecutive bins according to its needs. The transmitters are synchronized such that the data corresponding to a frame arrives simultaneously at the receiver.

Figure 5:
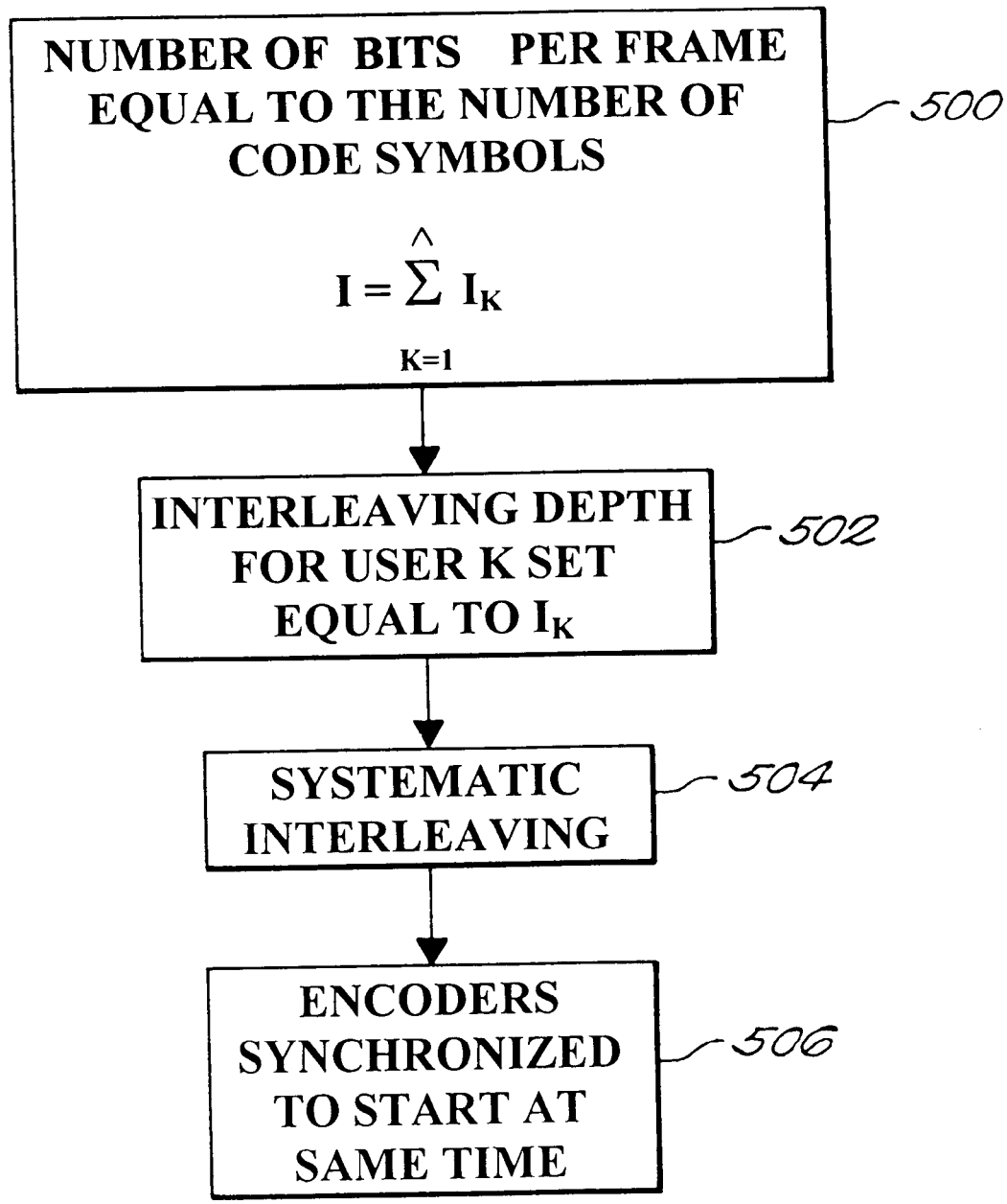
FIG. 5 is a flowchart of the FEC method for multipoint to point DMT(DWMT) communication systems in accordance with the invention.

The FEC method proposed for multipoint-to-point DMT (DWMT) communication systems consists of the elements described hereinafter and with reference to the flowchart of FIG. 5.

Initially, the number of bits per DMT(DWMT) frame assigned to each user makes up an integer number of Reed-Solomon symbols (Step 500). For example, for RS code over GF(256) this means an integer number of bytes. The notation $I_k$ will be used for the numbers of RS symbols per frame assigned to the user k. The sum $$I = \sum_{k=1}^{n} I_k$$

is equal to the number of RS symbols sent in a DMT (DWMT) frame.

The interleaving depth for user k is set equal to $I_k$ (Step 502). In this manner, the data sent by user k in a DMT (DWMT) frame occupies a full line of its interleaving RAM at the receiver. The RS block length, N and the number of errors which can be corrected per codeword, t, are the same for all users.

The systematic interleaving as described heretofore is the interleaving method used by each RS encoder (Step 504).

Finally, the encoders are synchronized by the DMT (DWMT) supervisory frame mechanism, such that the encoders start processing their interleaving frames at the same time (Step 506). The start of the interleaving frame is defined by the first RS symbol of the first codeword in that frame. In this manner, the first frame will contain the data which will be stored in the first row of individual deinterleaver RAMs, the second frame of data will be placed in the second RAM row, and so on.

Figure 6:
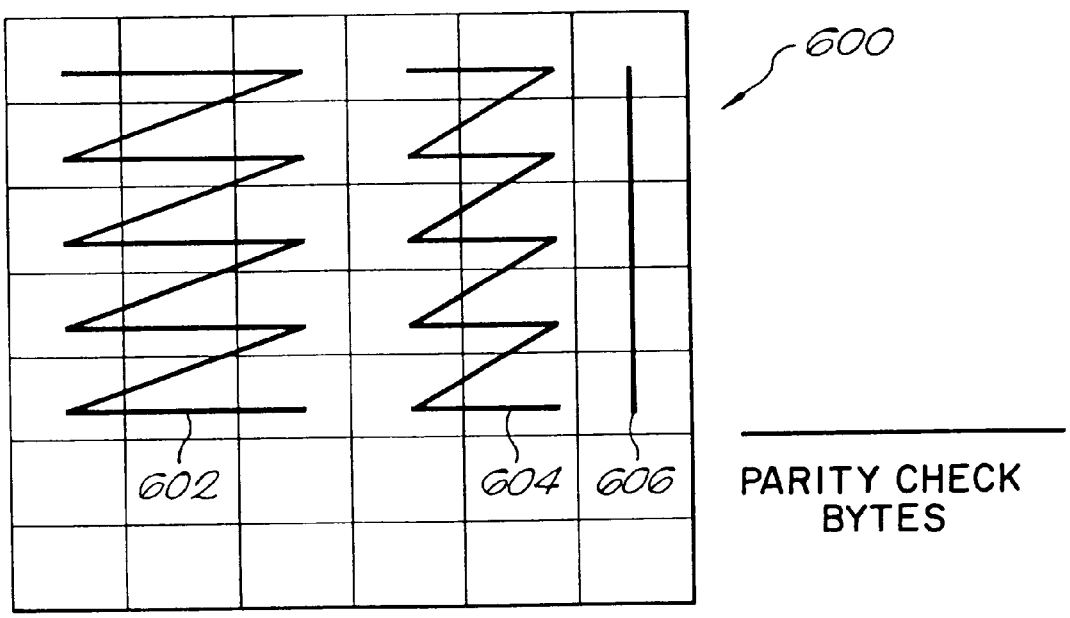
FIG. 6 is a block diagram of a DWMT upstream deinterleaver RAM.

At the receiving end, the data frames are written in subsequent rows of a single deinterleaver RAM with N rows and I columns. Under the previously described four conditions, data corresponding to the first multiuser will occupy the first $I_1$ columns, the data of the second multiuser will occupy the next $I_2$ columns, and so on as shown in the exemplary block diagram of a DWMT upstream deinterleaver RAM 600 in FIG. 6. In FIG. 6, it will be appreciated that $I_1$=3 (602), $I_2$=2 (604), and $I_3$=1 (606).

The last rows contain the checksum bytes. Each column contains a Reed-Solomon codeword. After receiving N DMT(DWMT) frames of data (this corresponds to an interleaving frame) one decoder can be used to correct the codewords (columns), then the information symbols must be read along the rows within each individual multiuser space as shown with full lines in FIG. 6. Buffering of the RAM is necessary, and another RAM buffer is used to store the new data, while the data from the present RAM is corrected and read out.

The system and method of the invention fulfills the previously described conditions. First, the RAM size associated with each encoder is 2•t•I to cover the case when the whole channel capacity is allocated to only one user. This is considerably less than the RAM size associated with other interleaving methods, which is of the order of N•I. This is due exclusively to the use of systematic interleaving method. Other methods can be used instead of it, block interleaving for instance, but they require considerably larger RAM size at each encoder.

Second, only one RAM of size N·I is necessary for the deinterleaver instead of using a similar size RAM for each multiuser at the receiver to cover the worst case (maximum channel capacity allocated to one of the users).

Lastly, only one Reed-Solomon decoder is needed, instead of multiple ones.

The architectural simplifications resulting from the aforementioned system and method of the invention translate into major savings in terms of silicon area and power dissipation.

Figure 7A:
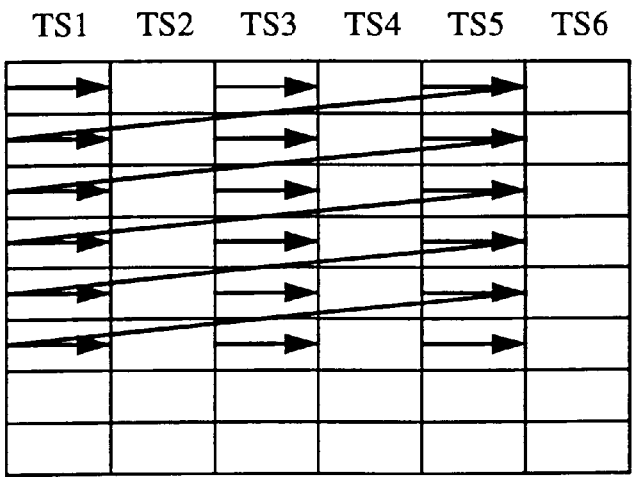
FIGS. 7A–7C are block diagrams of a deinterleaver RAM for a TDM system showing the individual RAM sections for three different users.
Figure 7B:
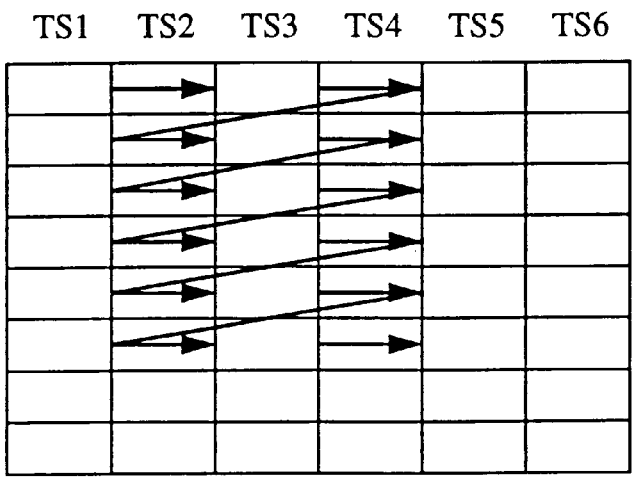
Figure 7C:
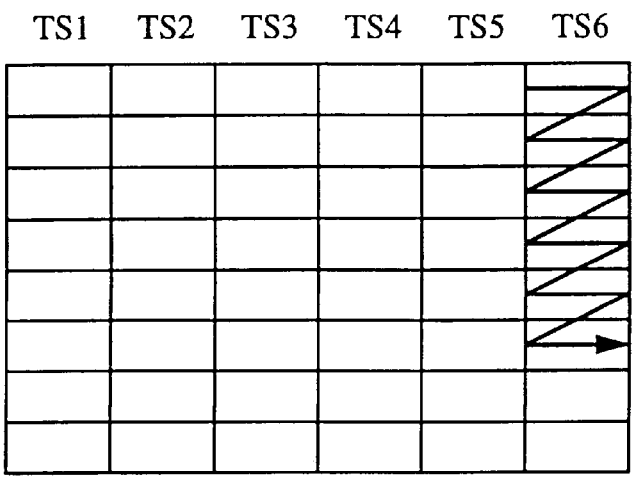

It will be appreciated by those of skill in the art that the invention is also applicable to TDM multipoint to point communication systems. In TDM multipoint to point communication systems, data is transmitted in frames. Each frame is subdivided into several timeslots. A certain number of timeslots are assigned to each multiuser, thus the data throughput requirements are satisfied by assigning a corresponding number of timeslots to each user. The timeslots assigned to a certain user are not necessarily adjacent. For instance, if a system has three users A, B, and C, and the frame has 6 timeslots, timeslots 1, 3, and 5 may be assigned to user A, timeslots 2 and 4 to user B, and timeslot 6 to user C. FIGS. 7A–7C are block diagrams of a deinterleaver RAM in a TDM system for users A, B and C. It will be appreciated that the data is not contiguous as data arrives in different time slots.

Figure 8:
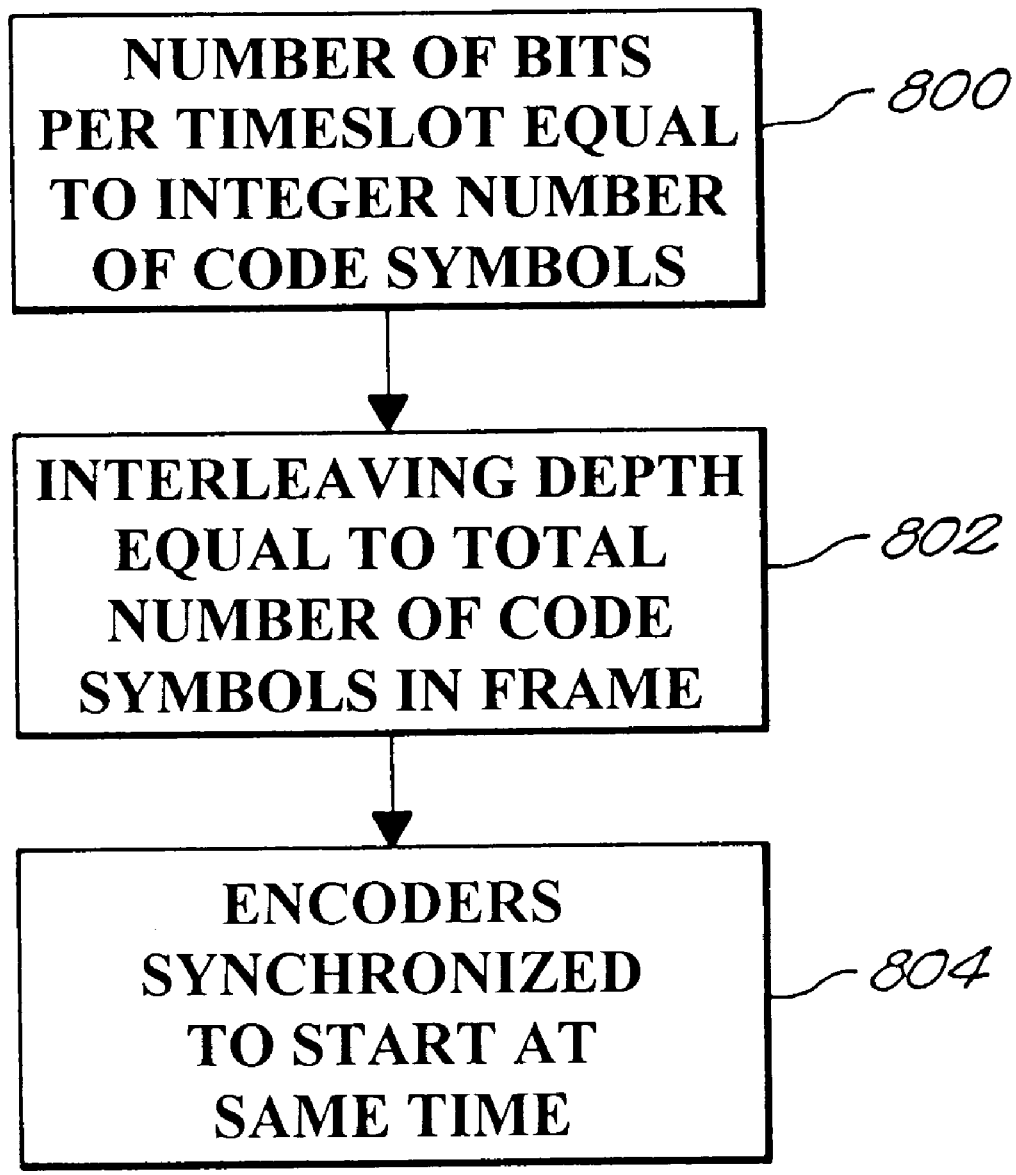
FIG. 8 is a flowchart of the FEC method for multipoint to point TDM communication systems in accordance with the invention.

The same principles described with respect to DMT can be applied to TDM systems in accordance with the process described with reference to the flowchart of FIG. 8.

First, the number of bits sent in a timeslot define an integer number of code symbols (Step 800). The timeslot represents the minimum data load, which can be sent by a user.

Second, the interleaving depth should be made equal to the total number of code symbols sent by a user in a frame (Step 802). In the example provided for illustration purposes, if a RS code over GF(256) is used, the symbols of which are bytes of data, and the timeslots allow for sending 20 bytes, the interleaving depth is 60 for user A, 40 for user B, and 20 for user C. In general, if S is the number of code symbols sent in a timeslot and $N_k$ is the number of timeslots assigned to the k-th user, the interleaving depth for this user will be $I_k=N_k\cdot S$.

Finally, the encoders are synchronized such that all the encoders will send out the first code symbol in an interleaving frame as the first data byte into the same data frame (Step 804).

At the receiver end, the decoding is similar to that for the DMT system. The data corresponding to a frame is stored as a row in the interleaving RAM. After the entire interleaving frame is received and the errors corrected, data is read for each user along the lines as shown in FIGS. 7A–7C. The only difference is that the timeslots may not be adjacent.

Analysis has shown that the case where the data sent by a user is a submultiple of its interleaving depth is also possible. For the DWMT case, let $d_k$ be the data allowed to user k in a frame and D the total data in a frame, both of them expressed in RS symbols such that $D=\Sigma d_k$.

Figure 9A:
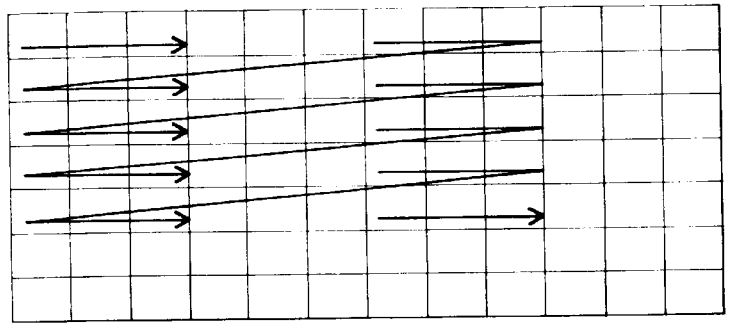
FIGS. 9A–9C are block diagrams of DWMT deinterleaver RAMs for three users where m=2 showing the individual RAM sections for each user and the data read operation out of the individual RAM sections.
Figure 9B:
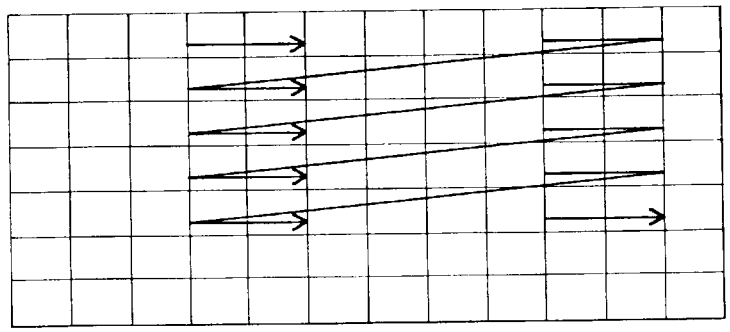
Figure 9C:
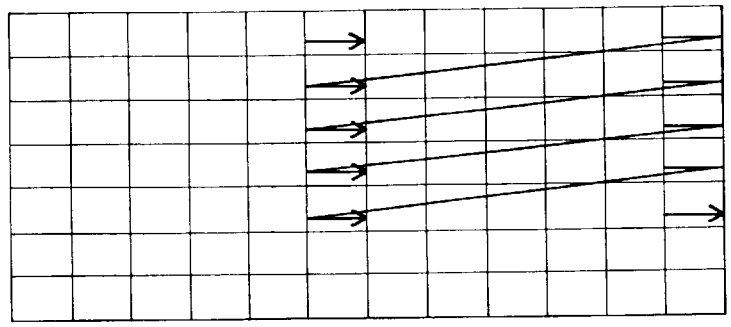

Accordingly, the interleaving depth for user k, $I_k$ can be set to be a multiple of $d_k$, i.e., $I_k=m\cdot d_k$. The factor m is common to all users. At the receiving end, the data will be put in a RAM of size N by I, where $I=m\cdot D$. The first m data frames in an interleaving frame are placed in the first row of the deinterleaving RAM, the next m data frames in the second row and so on. A corresponding example for that from FIG. 6 for m=2 is shown in FIGS. 9A–9C. FIGS. 9A–9C are block diagrams of a DWMT deinterleaver RAM showing individual RAM sections for users A, B and C and the data read operation out of these sections.

The same holds for TDM systems, the interleaving depth for user k can be equal to $I_k=m\cdot S\cdot N_k$. The data arrangement in the interleaving RAM is similar, i.e., the first m data frames go into the first RAM row and so on.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A forward error correction (FEC) method for use in a multipoint-to-point frame based synchronized transmission communication system in which data from users are sent in selected portions of data frames having coded symbols added thereto by encoders associated with each user, said method comprising:

establishing the number of bits per user assigned portions of data frames as an integer number of FEC code symbols;

setting interleaving depth equal to a multiple of the total number of code symbols sent by a user in a data frame; and synchronizing said encoders such that all of said encoders start processing associated interleaving frames at the same time.

2. The method of claim 1, wherein said communication system comprises a discrete multitone (DMT) or a discrete wavelet multitone (DWMT) communication system.

3. The method of claim 2, wherein said data from each user is sent in assigned frequency bins of the data frames.

4. The method of claim 3, wherein said establishing step further comprises establishing the number of bits per data frame assigned to each user as an integer number of FEC code symbols.

5. The method of claim 4, wherein said number of data frame FEC code symbols, D, follows the sum $$D = \sum_{k=1}^{n} d_k,$$

where $d_k$ is the number of FEC code symbols per data frame assigned to user k.

6. The method of claim 5, wherein said setting step further comprises setting said interleaving depth for user k equal to $I_k=m\cdot d_k$, where $d_k$ is the number of FEC code symbols per data frame assigned to user k and m is a constant, such that the data sent by user k in m successive data frames occupies a full line of an associated deinterleaving RAM at a receiver.

7. The method of claim 6, wherein said synchronizing step further comprises sending out the first symbol in an interleaving frame as the first symbol into the same data frame so that the data frames will contain data to be stored in the corresponding rows of a deinterleaver RAM at said receiver.

8. The method of claim 7 further comprising writing received data frames at said receiver in subsequent rows of a single deinterleaver RAM with N rows and $I=\Sigma I_k$ columns, where $I_k$ is the interleaving depth for user k, such that each column contains a FEC codeword.

9. The method of claim 8 further comprising using one decoder in response to receiving N data frames to correct the FEC codewords and thereafter reading out data from each user along the rows of its assigned section of said RAM.

10. The method of claim 1, wherein said communication system comprises a time division multiplexed (TDM) communication system.

11. The method of claim 10, wherein said data from each user is sent in assigned timeslots of the data frame.

12. The method of claim 11, wherein said establishing step further comprises establishing the number of bits per TDM timeslot of data frame assigned to each user as an integer number of FEC code symbols.

13. The method of claim 12, wherein said setting step further comprises setting said interleaving depth for user k equal to the product $I_k=m\cdot N_k\cdot S$, where S is the number of code symbols sent in a timeslot, $N_k$ is the number of timeslots assigned to user k, and m is an integer constant factor.

14. The method of claim 13, wherein said synchronizing step further comprises sending out the first code symbol in an interleaving frame as the first data symbol into the same data frame so that the data frames will contain data to be stored in the corresponding rows of a deinterleaver RAM at said receiver.

15. The method of claim 14 further comprising writing received data frames at said receiver in subsequent rows of a single deinterleaver RAM with N rows and $I=\Sigma I_k$ columns, where $I_k$ is the interleaving depth for user k, such that each column contains a FEC codeword.

16. The method of claim 15 further comprising using one decoder in response to receiving N data frames to correct the FEC codewords and thereafter reading out data from each user along the rows of its assigned section of said RAM.

17. A forward error correction (FEC) system for use in a multipoint-to-point frame based synchronized transmission communication system in which data from users are sent in selected portions of data frames having coded symbols added thereto by encoders associated with each user, said system comprising:
- means for establishing the number of bits per user assigned portions of data frames as an integer number of FEC code symbols;
- means for setting interleaving depth equal to a multiple of the total number of code symbols sent by a user in a data frame; and
- means for synchronizing said encoders such that all of said encoders start processing associated interleaving frames at the same time.

18. The system of claim 17, wherein said communication system comprises a discrete multitone (DMT) or a discrete wavelet multitone (DWMT) communication system.

19. The system of claim 18, wherein said data from each user is sent in assigned frequency bins of the data frames.

20. The system of claim 19, wherein said establishing step further comprises establishing the number of bits per data frame assigned to each user as an integer number of FEC code symbols.

21. The system of claim 20, wherein said number of data frame FEC code symbols, D, follows the sum $$D = \sum_{k=1}^{n} d_k,$$

where $d_k$ is the number of FEC code symbols per data frame assigned to user k.

22. The system of claim 21, wherein said setting means further comprises means for setting said interleaving depth for user k equal to $I_k = m \cdot d_k$, where $d_k$ is the number of symbols per data frame assigned to user k and m is a constant, such that the data sent by user k in m successive data frames occupies a full line of an associated interleaving RAM at a receiver.

23. The system of claim 22, wherein said synchronizing means further comprises means for sending out the first symbol in an interleaving frame as the first symbol into the same data frame so that the data frames will contain data to be stored in the corresponding rows of the deinterleaver RAM at said receiver.

24. The system of claim 23 further comprising means for writing received data frames at said receiver in subsequent rows of a single deinterleaver RAM with N rows and $I = \Sigma I_k$ columns; where $I_k$ is the interleaving depth for user k, such that each column contains a FEC codeword.

25. The system of claim 24 further comprising means for using one decoder in response to receiving N data frames to correct the FEC codewords and thereafter reading out data from each user along the rows of its assigned section of said RAM.

26. The system of claim 17, wherein said communication system comprises a time division multiplexed (TDM) communication system.

27. The system of claim 26, wherein said data from each user is sent in assigned timeslots of the data frame.

28. The system of claim 27, wherein said establishing means further comprises means for establishing the number of bits per TDM timeslot of data frame assigned to each user as an integer number of FEC code symbols.

29. The system of claim 28, wherein said setting means further comprises means for setting said interleaving depth for user k equal to the product $I_k = m \cdot N_k \cdot S$, where S is the number of code symbols sent in a timeslot, $N_k$ is the number of timeslots assigned to user k, and m is an integer constant factor.

30. The system of claim 29, wherein said synchronizing means further comprises means for sending out the first code symbol in an interleaving frame as the first data symbol into the same data frame so that the data frames will contain data to be stored in the corresponding rows of the deinterleaver RAM at said receiver.

31. The system of claim 30 further comprising means for writing received data frames at said receiver in subsequent rows of a single deinterleaver RAM with N rows and $I = \Sigma I_k$ columns, where $I_k$ is the interleaving depth for user k, such that each column contains a FEC codeword.

32. The method of claim 31 further comprising means for using one decoder in response to receiving N data frames to correct the FEC codewords and thereafter reading out data from each user along the rows of its assigned section of said RAM.

* * * * *